(12) United States Patent
Cornell et al.

(10) Patent No.: US 8,314,922 B2
(45) Date of Patent: Nov. 20, 2012

(54) TELECENTRICITY CORRECTOR FOR MICROLITHOGRAPHIC PROJECTION SYSTEM

(75) Inventors: Jim D Cornell, Rochester, NY (US); Joseph D Malach, Newark, NY (US); Paul Francis Michaloski, Rochester, NY (US); James Edson Webb, Fairport, NY (US)

(73) Assignee: Corning Incorporated, Corning, NY (US)

( * ) Notice: Subject to any disclaimer, the term of this patent is extended or adjusted under 35 U.S.C. 154(b) by 630 days.

(21) Appl. No.: 12/494,882

(22) Filed: Jun. 30, 2009

(65) Prior Publication Data

US 2009/0323040 A1 Dec. 31, 2009

Related U.S. Application Data

(60) Provisional application No. 61/076,888, filed on Jun. 30, 2008.

(51) Int. Cl.
*G03B 27/68* (2006.01)
*G03B 27/52* (2006.01)
(52) U.S. Cl. ............... 355/71; 355/52; 355/77
(58) Field of Classification Search ............ 355/50, 355/52, 53, 67, 71, 77
See application file for complete search history.

(56) References Cited

U.S. PATENT DOCUMENTS

| 4,906,080 A | * | 3/1990 | Omata ................. 359/708 |
| 5,461,456 A | | 10/1995 | Michaloski |
| 5,739,899 A | | 4/1998 | Nishi et al. |
| 6,522,386 B1 | * | 2/2003 | Nishi ................. 355/53 |
| 7,233,386 B2 | * | 6/2007 | Reisinger et al. ........... 355/55 |
| 2001/0012101 A1 | | 8/2001 | Mulkens |
| 2002/0149756 A1 | * | 10/2002 | Tokuda et al. .............. 355/53 |
| 2006/0146304 A1 | | 7/2006 | Schwab et al. |
| 2008/0030707 A1 | * | 2/2008 | Tanaka et al. .............. 355/67 |
| 2009/0021830 A1 | * | 1/2009 | Totzeck et al. ............. 359/499 |
| 2009/0323040 A1 | * | 12/2009 | Cornell et al. ............. 355/67 |

FOREIGN PATENT DOCUMENTS

| WO | 2006029796 A2 | 3/2006 |
| WO | 2007/130299 A2 | 11/2007 |

OTHER PUBLICATIONS

Laser Beam Shaping Applications, Editor Fred Dickey et al., Chapter 1: "Illuminators for Microlithography", Paul Michaloski.

* cited by examiner

*Primary Examiner* — Thomas R Artman
(74) *Attorney, Agent, or Firm* — Timothy M. Schaeberle

(57) ABSTRACT

A telecentricity corrector is incorporated into a microlithographic projection system to achieve telecentricity targets at the output of the microlithographic projection system. The telecentricity corrector is located between an illuminator and a projection lens of the projection system, preferably just in advance of a reticle for controlling angular distributions of light illuminating the reticle.

14 Claims, 4 Drawing Sheets

TELECENTRICITY CORRECTOR FOR MICROLITHOGRAPHIC PROJECTION SYSTEM

CROSS-REFERENCE TO RELATED APPLICATIONS

This application claims the benefit of priority under 35 U.S.C. §119(e) of U.S. Provisional Application Ser. No. 61/076,888 filed on Jun. 30, 2008.

TECHNICAL FIELD

The invention relates to illuminators of projection systems, particularly microlithographic projection systems for relaying images of reticles, masks, or other pattern formers onto photosensitive substrates for such purposes as manufacturing semiconductor devices and other integrated circuits including flat panel displays, printed circuit boards, and micromechanical devices.

BACKGROUND

The projection lenses of microlithographic projection systems are generally telecentric at least in image space so that the projected images are less sensitive to focusing errors, e.g., maintain the same magnification through the depth of focus. Particularly when partial coherence illumination is provided, design considerations for telecentricity extend into the performance of illuminators of the projection lenses. The effective telecentricity of the projection systems is then determined by the illuminator's angular radiance distribution at the image plane of the projection lens. In telecentric image space, centroids of energy within the angular radiance distributions at the image points extend normal to the image plane. The illuminator image plane, which is located at the object plane of the projection lens, corresponds to a uniform irradiance plane formed by the illuminator. The field of the uniform irradiance is commonly limited within the illuminator by imaging a field stop, such as adjustable blades or the edges of the output face of a kaleidoscope, onto the illuminator image plane.

Whether the projection lenses are singly telecentric (telecentric in image space) or doubly telecentric (telecentric in both image and object space), chief rays illuminating field points on the reticle or mask pattern arrive at conjugate field points on the substrate normal to the surface of the substrate. Departures from telecentricity in the object space of the reticle or mask can be made to support magnification adjustments, such as by axial translations of the mask or reticle within the object space. The illumination pattern at the image plane of the illuminator can be arranged to match the desired departure from telecentricity in the object plane of the projection lens to preserve telecentricity within the image plane of the projection lens.

For some projection lenses, even those intended to be nominally telecentric in object space as well as image space, complex or higher order departures from telecentricity may be required at the output of the illuminator to achieve the desired telecentricity in the image space of the projection lens. The required departures from telecentricity in the image space of the illuminator can add considerable complexity to the design of illuminators and can also disrupt irradiance uniformity, which is also required at the image plane of the projection lens.

SUMMARY

A telecentricity corrector within an illuminator can be used in accordance with this invention to match complex or higher order telecentricity departures in the object space of a projection lens as required for achieving a desired degree of telecentricity within the image space of the projection lens. The need for complex or higher order telecentricity departures can arise as a result of the design of the projection lens or as a consequence of limitations or errors in the implementation of the design. The object space telecentricity departures known from the design of the projection lens can be incorporated into the telecentricity corrector as a part of the projection lens system. In fact, the additional design freedoms of the telecentric corrector can be incorporated into the overall design of the projection system to balance requirements for telecentricity at the image plane of the projection lens with requirements for irradiance uniformity at the same image plane.

Once the projection system is built, the telecentric corrector can be supplemented, further modified, or replaced with a new telecentric corrector to compensate for systematic errors arising during use of the projection system. For example, measurements can be taken of the irradiance in the image space of the projection lens to note positional or intensity fluctuations across the image plane and through the depth of focus. Alternatively, the results of the irradiance in a photosensitive substrate can be used to infer the degrees of telecentricity and irradiance uniformity.

The telecentricity corrector, which is preferably located in the image space of the illuminator that adjoins the object space of the projection lens, can be fashioned in plate form with one or more corrective optical surfaces for locally refracting light through different angles as a function of radial distance or azimuthal angle with respect to an optical axis of the illuminator. In a general sense, the telecentricity corrections can be made by local adjustments to the slope of the corrective surface, which can be integrated to form an uninterrupted aspheric surface. The rates of variation in slope across the aspheric surface required for blending the local slope variations can also be controlled to affect output power variations across the aspheric surface, which is useful as a uniformity correction at the image plane of the projection lens. The local slope adjustments of the corrective surface are analogous to adding small prisms to the corrective surface that locally redirect segments of the beam, resulting in telecentricity changes at the image plane of the illuminator. The adjustments to the rate of variation in the slope are analogous to adding small lenses to the corrective surface that locally converge or diverge segments the beam, resulting in changes the local irradiance at image plane of the illuminator.

The changes to the corrective surface in terms of a first derivative (slope) and a second derivative (power) can be calculated directly from the required telecentricity correction (as a corresponding change in local slope) and the irradiance uniformity correction (as a corresponding local change in power). The calculation is also dependent upon the distance offset between the corrector surface and the image plane. The offset distance in combination with the local changes in the slope of the corrector surface shifts location at which the redirected segments of the beam are incident at the image plane. The offset distance in combination with the local changes in the rate of variation in slope of the corrector surface affects the magnitude of the irradiance change at the image plane. Generally, a locally converging beam increases local irradiance at the image plane as a function of the offset distance from the image plane, and a diverging beam decreases local irradiance at the image plane as a function of the offset distance from the image plane. Either way, some offset distance is required to effect the local changes in irradiance, while no offset distance is required to effect local changes in telecentricity. The resolution with which changes can be made to either the local telecentricity or local irradiance distribution at the image plane tends to decrease with increased offset distance from the image plane because the light at any one point of the corrector plate influences an increased area of the image plane.

Corrections for telecentricity and irradiance uniformity made at the image plane of the illuminator for meeting target specifications at the image plane of the projection lens can be further separated by providing two or more corrective surfaces with a first of the corrective surfaces located proximate (i.e., at or very near) the image plane of the illuminator and with a second of the corrective surfaces still located within the image space of the illuminator but offset from the image plane of the illuminator. The first corrective optic is preferably located as close as possible to the image plane to effect telecentricity corrections without affecting the irradiance distribution. The second corrective optic is offset from the image plane to effect changes in the irradiance distribution in addition to changes in telecentricity, but preferably remains well within the image space of the illuminator to effect the changes in irradiance distribution with sufficient resolution throughout the image field. Thus, the second corrective optic is optimized for correcting irradiance uniformity at the image plane of the projection lens and the first corrective optic is optimized for correcting telecentricity at the image plane of the projection lens while also compensating for any unwanted telecentricity changes produced by the second corrective optic.

Although the corrective optics are described as being located near the image plane of the illuminator or at least within the image space of the illuminator, this description is also intended to cover conjugate locations within the illuminator, such as at the object plane of a relay lens containing a field stop. Since the conjugate plane is located well within the illuminator, the corrective optics can be located in either order and on the same or opposite sides of the conjugate plane. In contrast, near the coincident image plane of the illuminator and object plane of the projector lens, the corrective optics preferably remain within the illuminator space so that the corrective optics do not introduce wavefront errors into the imaging function of the projection lens.

BRIEF DESCRIPTION OF THE DRAWING FIGURES

DETAILED DESCRIPTION

Figure 1:
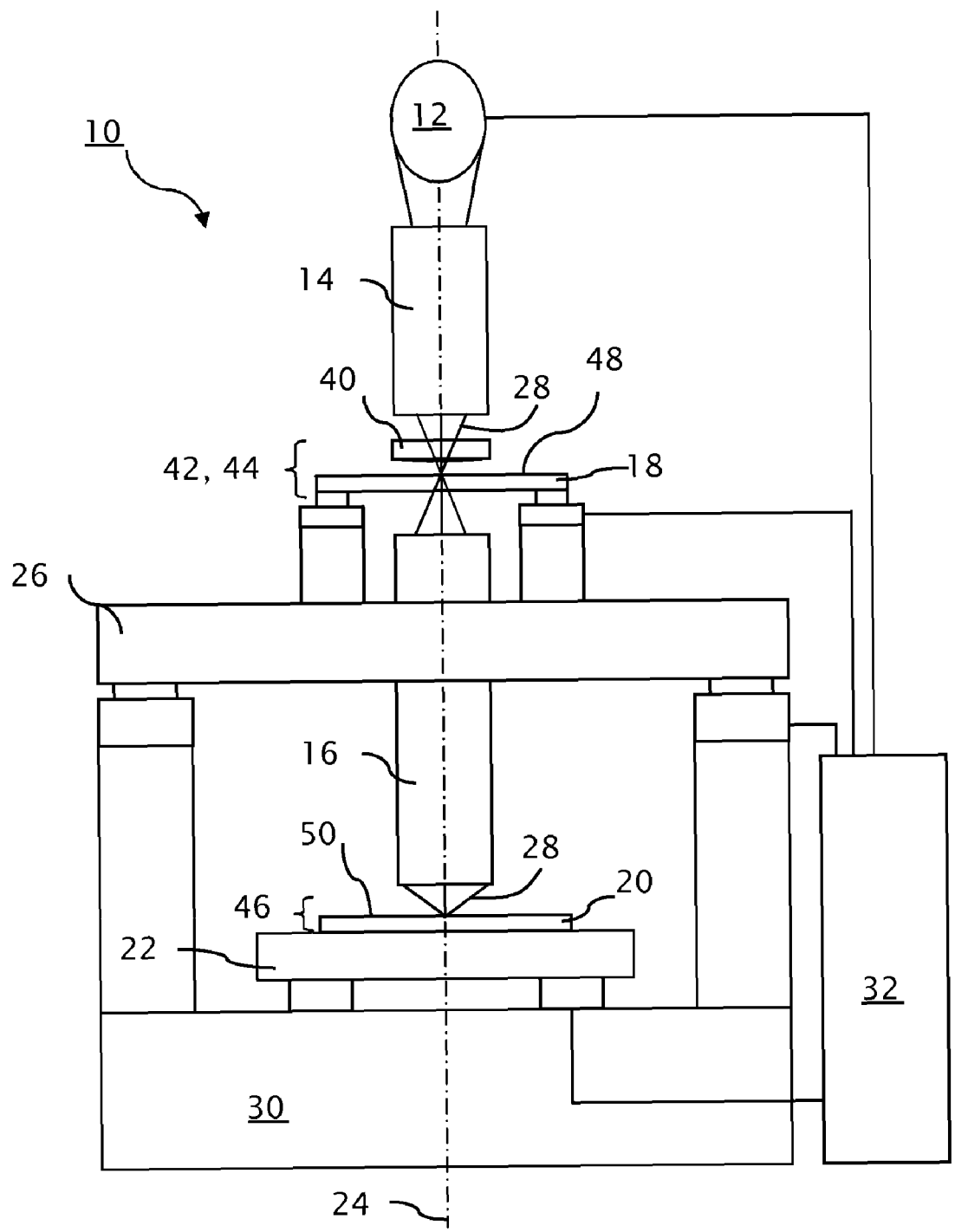
FIG. 1 is a diagram of a microlithographic projection system incorporating a telecentricity corrector in accordance with the invention.

A microlithographic projection system 10, as an example of a projection system capable of benefiting from the invention, includes a light source 12, an illuminator 14, and a projection lens 16 for projecting an image of a reticle 18 onto a substrate 20. A horizontal X-Y-axis stage 22, which is translatable in two orthogonal directions normal to a common optical axis 24 of the illuminator 14 and the projection lens 16, provides for relatively moving the substrate 20 with respect to the projection lens 16 for exposing successive areas of the substrate 20. A vertical Z-axis stage 26 provides for relatively translating the projection lens 16 with respect to the substrate 20 along the optical axis 24 to provide for appropriately focusing the image of the reticle 18 onto the substrate 20.

The light source 12 can take a variety of forms for emitting radiation in the form of a beam of light 28 appropriate for developing the photosensitive substrate 20. For example, the light source 12 can be a lamp source such as a high-pressure mercury arc lamp targeting certain spectral lines or a laser source, such as an excimer laser, particularly for operating within the deep ultraviolet spectrum.

The illuminator 14 provides for shaping and spatially distributing the light beam 28 and targeting angular and spatial irradiance profiles set for both the pupil and image plane of the projection lens, the latter coinciding with the substrate 20. Although not shown in detail in FIG. 1, typical illuminators for microlithographic operations include a profiler for collecting and shaping the beam 28, a uniformizer (e.g., a kaleidoscope or fly's eye array) for integrating the light into a uniform irradiance field, and a relay lens for relaying an image of the output of the uniformizer to the reticle 18, where an image plane of the illuminator 14 coincides with an object plane of the projection lens 16.

The projection lens 16, which preferably has an entrance numerical aperture larger than an exit numerical aperture of the illuminator 14 for providing partial coherent imaging, projects an image of the reticle 18 onto the substrate 20. That is, a pupil (not shown) of the projection lens 16, which is typically conjugate to a pupil (also not shown) in the illuminator 14, is preferably underfilled by the image of the illuminator pupil but is sized to collect angularly divergent light from illuminated features of the reticle 18 to produce a high resolution image of the reticle 18 on the substrate 20. The projected image of the reticle 18 can be enlarged or reduced as required. The projection lens 16 can include reflective or diffractive elements as well as refractive elements or combinations of such elements, such as in catadioptric optics.

The reticle 18, also referred to as a "mask", includes one or more patterns intended for projection onto the substrate 20 and can be sized within or beyond the size of the entrance pupil of the projector lens 16. Reticles with larger patterns can be relatively translated with respect to the projection lenses to expose different parts of the reticle patterns in succession.

The photosensitive substrate 20 generally takes the form of a flat plate, such as a semiconductor wafer or glass panel treated with a photoresist to react to exposures of light. Often, the entire substrate 20 cannot be imaged at once, so the horizontal X-Y-axis translational stage 22 on a base 30 provides for translating the substrate 20 through a range of positions for collectively illuminating a desired working area of the substrate 20. The projection lens 16 is supported on the vertical Z-axis translational stage 26 above the base 30 for adjusting the image distance of the projection lens 16 from the substrate 20 along the optical axis 24. A controller 32 coordinates relative motions between the projection lens 16, the reticle 18, and the substrate 20 as well as the exposure of the projection system 10.

Figure 2A:
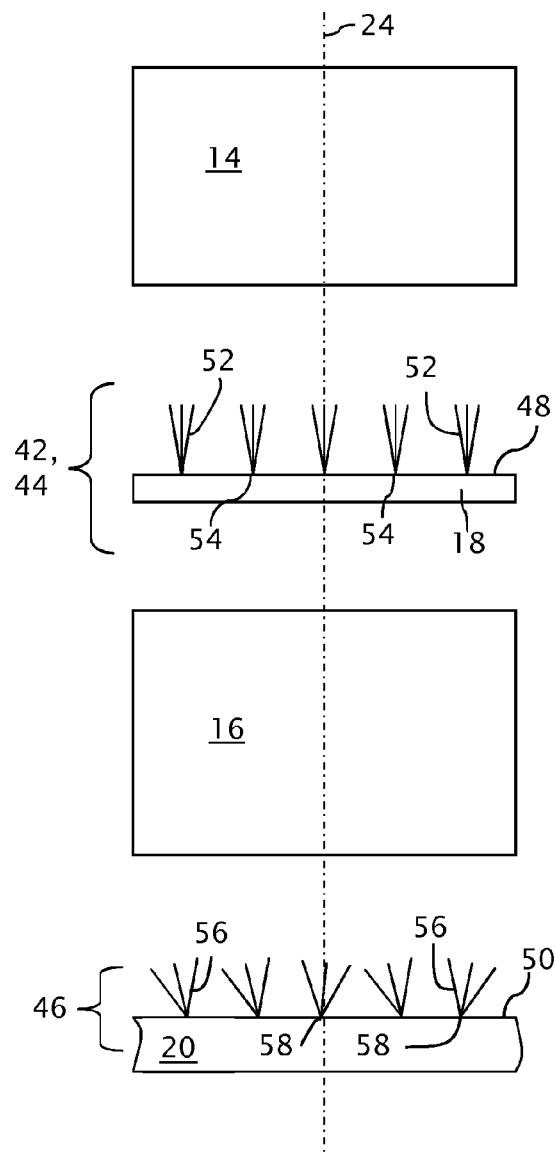
FIG. 2A is a diagram of a portion of the projection system absent the telecentricity corrector showing telecentricity errors in the image space of the projection lens.

A telecentricity corrector 40 is positioned within an image space 42 of the illuminator 14 as close as possible to the reticle 18 for redistributing the illuminator's angular irradiance within an adjoining object space 44 of the projection lens 16 to assure that the projection system 10 is telecentric at least within an image space 46 of the projection lens 16. Absent, the telecentric corrector 40, as depicted in FIG. 2A, a nominally telecentric irradiance within the adjoining image space 42 of the illuminator 14 and object space 44 of the projection lens 16 (depicted as vertically oriented cones of light 52 illuminating individual object points 54 on the patterned surface 48 of the reticle 18—the image plane of the illuminator 14 and object plane of the projection lens 16) results in a non-linear departure from telecentricity in the image space 46 of the projection lens 16 (depicted as variously askew cones of light 56 forming corresponding image points 58 on a photosensitive surface 50 of the substrate 20—the image plane of the projection lens 16). The departure from telecentricity varies in both magnitude and direction across the surface 50 of the substrate 20. Although the patterned surface 48 of the reticle 18 is shown on the top surface of the reticle, the patterned surface 48 could also be located on the bottom surface of the reticle 18 as is often the case for protecting the patterned surface 48 and reducing the amount of glass through which the projection lens 16 is required to operate. Whether located on the top or the bottom surface of the reticle, the patterned surface 48 is preferably also located at the image plane of the illuminator 14 and object plane or the projection lens 16.

Figure 2B:
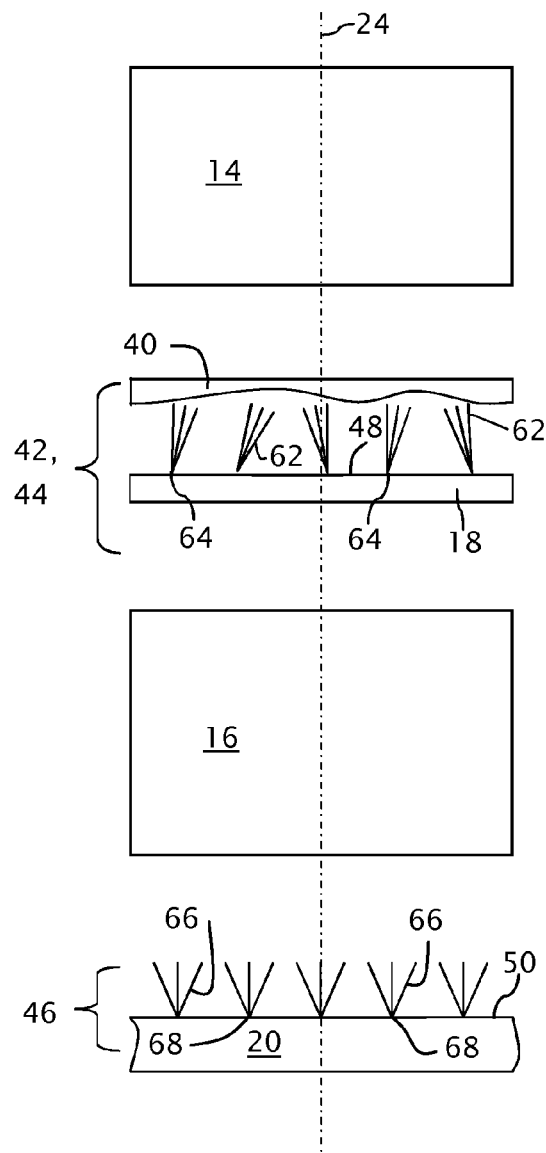
FIG. 2B is a similar diagram of a portion of the projection system incorporating the telecentricity corrector and showing a desired telecentricity correction in the image space of the projection lens.

The telecentricity corrector 40, as shown in FIG. 2B, compensates the apparent errors or design limitations within the projection lens 16 or reticle 18 by locally redistributing the angular irradiance distribution of the illuminator 14 in advance of the reticle 18 (depicted as variously askew cones of light 62 illuminating individual object points 64 on the surface 48 of the reticle 18) so that each feature on the reticle 18 is imaged telecentrically at the substrate 20 (depicted as vertically oriented cones of light 66 forming corresponding image points 68 on the surface 50 of the substrate 20). The telecentricity corrector 40 can similarly compensate for errors or design limitations within the illuminator 14, which result in or otherwise contribute to higher order departures from telecentricity within the image space 46 of the projection lens 16.

Figure 3:
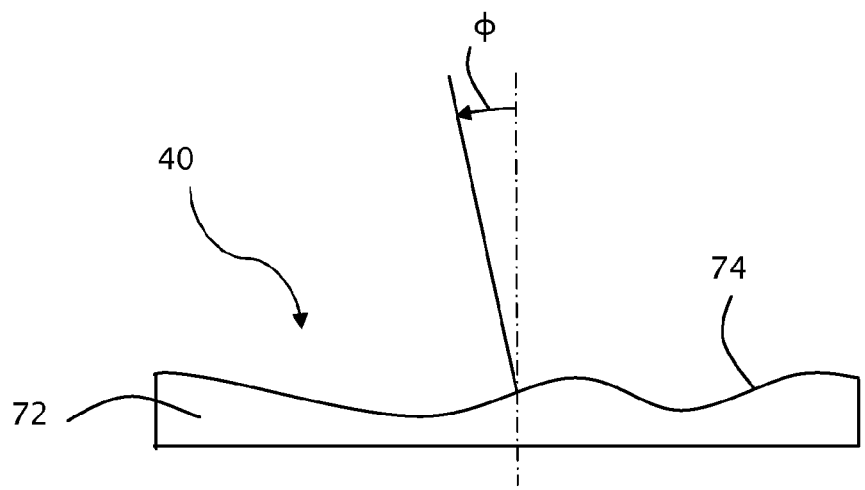
FIG. 3 is a schematic side view of the telecentricity corrector showing a corrective surface with exaggerated slope variations.

As shown in FIG. 3, the telecentricity corrector 40 has a substantially planar body 72 with a corrective surface 74 that departs from a planar form. The adjustments to the angular irradiance distributions of the illuminator 14 can be made by shaping the corrective surface 74 to include local slope variations (depicted as the angle $\phi$) for bending rays in differing amounts and directions across the field of illumination. The local slope $\phi$ on the corrective surface 74 can be regarded as a first derivative of the sag of an aspheric surface. The additional freedoms made possible by the higher-order changes to the corrective surface 74 can be incorporated into standard lens defining code for optimizing the local slope variations across the corrective surface 74. For example, such design freedoms can be optimized within Code V optical design software available from Optical research associates headquartered in Pasadena, Calif.

The rates of change in slope ($\Delta\phi$) from point to point across the corrective surface 74, which can be regarded as a second derivative of the sag of the aspheric surface, produce localized optical power variations that affect the irradiance uniformity across the image plane 50 of the projection lens 16. The optical power variations for locally converging or diverging light operate through an offset distance between the corrective surface 74 and the patterned surface 48 of the reticle 18, coinciding with the image plane of the illuminator 14 and the object plane of the projection lens 16. The local irradiance distribution effects at the patterned surface are proportional to the distance the corrective surface 74 is offset from the patterned surface 48. However, the resolution with which the angular and spatial corrections can be made at the patterned surface 48 is inversely proportional to the offset distance.

The design of the telecentricity corrector 40 is preferably optimized for balancing the requirements for telecentricity and uniformity at the image plane 50 of the projection lens 16. In fact, when the telecentricity corrector 40 is incorporated into the original projection lens system design, where the design of other components are also subject to optimization, improvements can be made to both telecentricity and uniformity at the image plane 50.

Alternative or additional design constraints can be targeted by the incorporation or subsequent addition of the telecentricity corrector 40. For example, the projection lens 16 could be designed to be doubly telecentric (i.e., telecentric in both its object space 44 and image space 46) or to depart in a prescribed manner from telecentricity in the object space 44 for such purposes as supporting subsequent adjustments to magnification or distortion. Co-owned International Application No. PCT/US2007/010044 filed on Apr. 26, 2007, and published as WO 2007/130299, entering the US national stage as application Ser. No. 11/922,18 on Dec. 12, 2007, which is hereby incorporated by reference, exploits a non-linear variation in object plane telecentricity to provide adjustments to distortion and magnification. Desired telecentricity departures within the image plane 50 of the projection lens 16 to serve particular purposes can be similarly accommodated as targets of the design optimization.

In addition to or as an alternative to improving the original design of the projection system 10, the telecentricity corrector 40 can be used to compensate for systematic errors or alternative performance targets arising after the projection system 10 is built. For example, telecentricity or uniformity errors, regardless of their source, can be empirically measured and used as a basis for designing or redesigning the telecentricity corrector 40. The spatial or angular departures from the desired irradiance distribution can be measured at the image plane 50 of the projection lens 16 directly or inferred from errors associated with the exposure of known patterns on the substrate 20. The measured errors requiring compensation by the telecentricity corrector 40 can be incorporated into the conventional design software as targets of opposite sign.

While the telecentricity corrector 40 is shown as a nominally planar refractive optic having a single corrective surface subject to higher order variations in slope, the telecentricity corrector 40 could also be incorporated into refractive optics of different shape or non-refractive optics, such as reflective or diffractive optics. Gradient index variations could also be used in place of or in addition to surface form modifications for making the local redirections of light. Both entrance and exit surfaces can be used to contribute to the desired corrections. More than one telecentricity corrector could also be used, such as one corrector for incorporation into the original design and another corrector to compensate for later-measured errors. Preferably, the telecentricity corrector is incorporated into the design as an additional optical element, but the telecentricity correction could also be incorporated into an existing element of the design, such as by modifying the surface of an otherwise planar or spherical optic.

Figure 4:
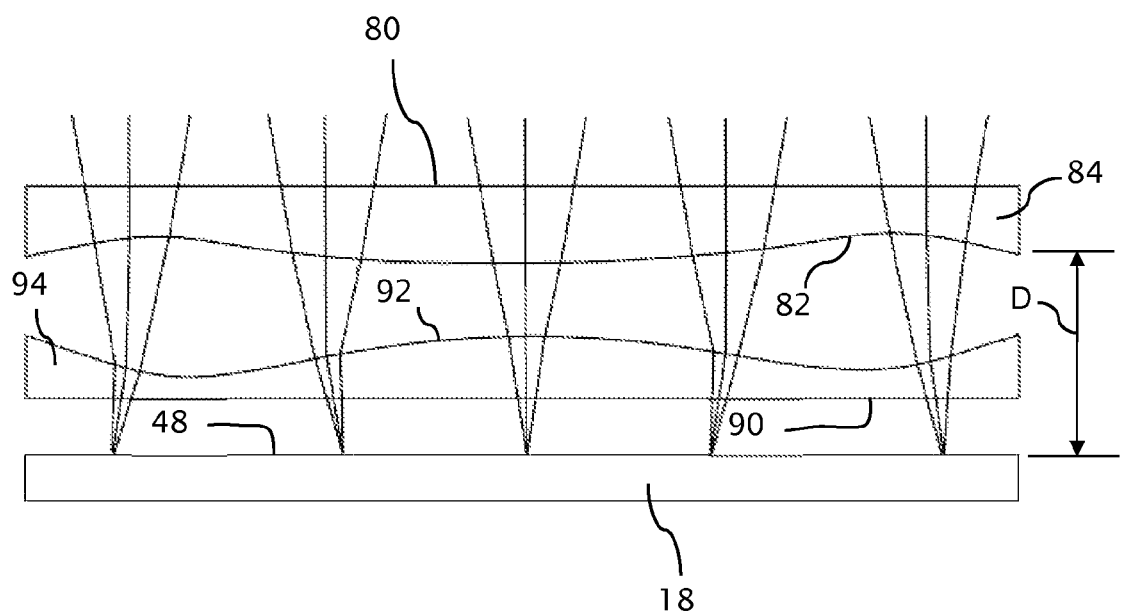
FIG. 4 is a schematic side view of a pair of corrector plates within the image space of an illuminator proximate to a reticle.

Although the telecentricity corrector 40 is preferably located as close as possible to the reticle 18 while accommodating mechanical constraints such as requirements for adjusting or replacing the reticle or clearance required protecting the reticle from environmental damage, the telecentricity corrector 40 could alternatively be located within an illuminator plane that is conjugate to the reticle 18, such as a plane adjacent to the output of the uniformizer. Separate telecentricity correctors could be located in each of the two or more conjugate planes to better meet the targets for telecentricity and uniformity at the image plane of the projection lens 16 as well as other targets for telecentricity or uniformity elsewhere in the design, such as at the object plane of the projection lens 16. The image space telecentricy corrector FIG. 4 illustrates the combination of two corrector plates 80 and 90 having respective aspheric corrective surfaces 82 and 92 formed in refractive bodies 84 and 94. The corrective surface 92 of the corrector 90 is located as close as possible to the patterned surface 48 of the reticle 18 for influencing telecentricity at the patterned surface 48 (i.e., at the image plane of the illuminator 14 and object plane of the projection lens 16) to a high resolution while having a minimal effect on the irradiance distribution at the patterned surface 48. The corrective surface 82 of the corrector 80 is located through an offset distance "D" from the patterned surface 48 for influencing both irradiance uniformity and telecentricity at the patterned surface 48. Local curvatures of the corrective surface 82 of the corrector 80 can be optimized to provide a desired irradiance distribution at the patterned surface 48. Local slopes of the corrective surface 92 of the corrector 90 can be optimized to provide the desired telecentricity at the patterned surface 48 while compensating for any unwanted telecentricity effects of the corrective surface 82. Together, the corrective surfaces 82 and 92 can be optimized to achieve both the desired telecentricity and the desired irradiance distribution at the image plane of the illuminator 14 at which the patterned surface 48 of the reticle 18 is located.

As a practical matter, some spacing is generally required between the corrective surface 92 and the image plane of the illuminator 14 to physically accommodate the reticle 18. As such the corrective surface 92 may also influence the distribution of light at the image plane, and even in conjunction with the other corrective surface 82, the optimization of the two surfaces 82 and 92 may require some compromise between the target values for telecentricity and irradiance uniformity at the image plane of the projection lens 16. However, as shown in an expanded view of the illuminator 14 depicted in FIG. 5, an alternative corrective optic 112 can be positioned with its corrective surface 114 at a uniform plane 116 conjugate to the image plane 122 of the illuminator 14 to provide for correcting telecentricity independently of irradiance uniformity.

Figure 5:
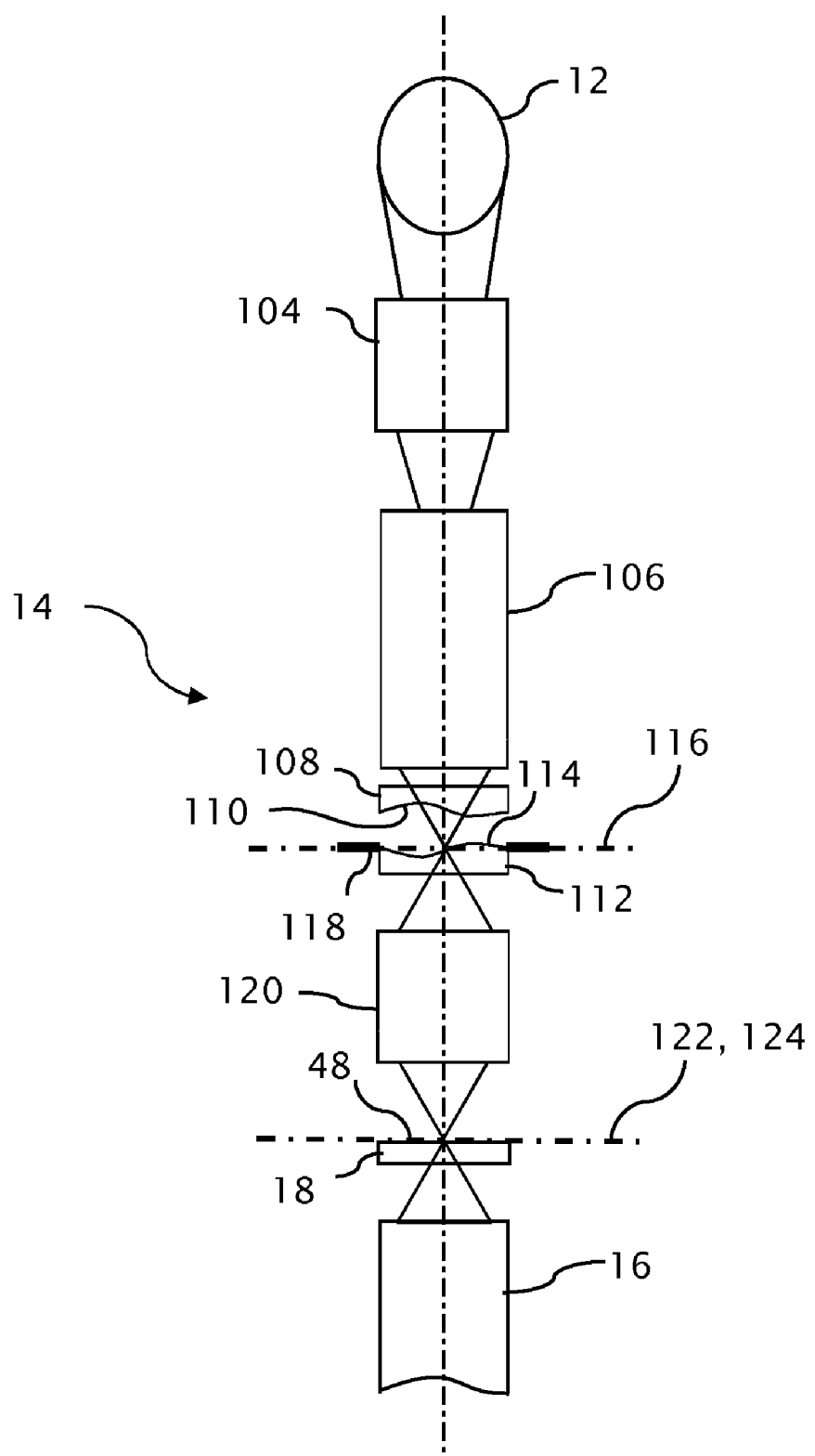
FIG. 5 is a diagram of the illuminator portion of the projection system showing a pair of corrector plates proximate to a plane conjugate to an image plane of the illuminator at the reticle.

The illuminator 14 as depicted in further detail in FIG. 5 includes a beam profiler 104 for shaping light from the light source 12 and for filling a uniformizer 106 that integrates the light into a uniform plane 116 containing field stop 118. A relay lens 120 images the field stop 118 onto the uniform image plane 122 of the illuminator 14, which is coincident with an object plane 124 of the projection lens 16. The patterned surface 48 of the reticle 18 is located at the coincident image and object planes 122 and 124 of the illuminator 12 and the projection lens 14. The corrective surface 114 of the corrective optic 112 is located at the conjugate uniform plane 116 for similarly influencing telecentricity at both the conjugate uniform plane 116 and the coincident image and object planes 122 and 124 independently of irradiance uniformity at the same image and object planes 122 and 124. A second corrective optic 108 includes a corrective surface 110 that is located offset from the conjugate plane 116 for influencing the irradiance distribution at both the conjugate uniform plane 116 and the coincident image and object planes 122 and 124. Although the second corrective optic 108 is preferably located between the uniformizer 106 and conjugate uniform plane 116 so as not to interfere with the imaging of the field stop 118, the second corrective optic 108 could also be located between the conjugate uniform plane 116 and the relay lens 120 because of the lower requirements for imaging within the illuminator 14 or in the illuminator image space between the relay lens 120 and the image plane 122.

Although the corrective surfaces 82 and 92 of the corrective optics 80 and 90 of FIG. 4 and the corrective surfaces 110 and 114 of the corrective optics 108 and 112 are shown as being fashioned on different refractive bodies (e.g., 84 and 88), the corrective surfaces 82, 92 and 110, 114 could be fashioned on opposite sides of single refractive bodies. The corrective surfaces 92 or 114 are preferably located as close a possible to the image plane 122 of the illuminator 14 or to the conjugate plane 116 within the illuminator 14 while the corrective surfaces 82 and 110 are offset through the thickness of the single refractive bodies.

Although the invention has been described with respect to a conventional microlithographic projection system 10, the invention is applicable to a wide range of lithographic projection systems including such projection systems in which the reticle pattern is formed by a programmable spatial light modulator. Other modifications and adaptations will be apparent to those of skill in the art based on the teaching set forth for this invention.

The invention claimed is:

1. A lithographic projection system comprising:
   a light source,
   an illuminator for receiving light from the light source for illuminating a reticle at an image plane of the illuminator,
   a projection lens for projecting an image of the reticle onto a substrate,
   a telecentricity corrector located proximate to the image plane or a conjugate of the image plane of the illuminator for making local angular redistributions of light illuminating the reticle to match target specifications for telecentricity at the substrate, and
   the telecentricity corrector includes a corrective surface having local slope variations for making the local angular redistributions of light,
   wherein rates of the variation in the local slope are adjusted to control irradiance uniformity across the substrate.

2. The projection system of claim 1 in which the telecentricity corrector is located within an image space of the illuminator.

3. The projection system of claim 1 in which the telecentricity corrector is located substantially adjacent or conjugate to the reticle.

4. A method of achieving telecentricity and irradiance uniformity targets for a microlithographic projection system including an illuminator and a projection lens comprising steps of
   defining the targets for telecentricity and irradiance uniformity at an image plane the projection lens, and
   optimizing designs of the illuminator, the projection lens, and a telecentricity corrector located proximate to an image plane or a conjugate of the image plane of the illuminator for approaching the targets for telecentricity and irradiance uniformity,
   wherein the optimization of the telecentricity corrector includes controlling local variations in the telecentricity corrector for approaching the target for telecentricity and controlling rates of change in the local variations in the telecentricity corrector for approaching the target for irradiance uniformity.

5. The method of claim 4 in which the local variations in the telecentricity corrector include local slope variations in a corrective surface and the rates of change in the local variations include rates of change in the local slope variations in the corrective surface.

6. The method of claim 4 in which the local variations in the telecentricity corrector include local refractive index variations in the telecentricity corrector and the rates of change in the local variations include rates of change in the local refractive index variations in the the telecentricity corrector.

7. A method of compensating for empirically measured errors in a lithographic projection system including an illuminator and a projection lens comprising steps of identifying telecentricity errors at an image plane of the projection lens, identifying irradiance uniformity errors at the image plane of the projection lens, setting revised telecentricity targets at an image plane of the illuminator to compensate for the identified telecentricity errors, setting revised irradiance uniformity targets at the image plane of the illuminator to compensate for the identified irradiance uniformity errors, incorporating local variations within a telecentricity corrector located proximate to the image plane or a conjugate of the image plane of the illuminator for meeting the revised telecentricity targets, and incorporating rates of change in the local variations within the telecentricity corrector for meeting the revised irradiance uniformity targets.

8. The method of claim 7 in which the telecentricity corrector has a corrective surface and the step of incorporating local variations includes controlling local slope variations in the corrective surface for approaching the revised telecentricity targets.

9. The method of claim 8 in which the step of incorporating rates of change in the local variations includes controlling rates of change of the local slope variations in the corrective surface for approaching the revised irradiance uniformity targets.

10. A lithographic projection system comprising:

a light source, an illuminator for receiving light from the light source for illuminating a reticle at an image plane of the illuminator, a projection lens for projecting an image of the reticle onto a substrate, a first corrective surface for making local angular redistributions of light illuminating the reticle to approach target specifications for telecentricity at the substrate, a second corrective surface for making local spatial redistributions of light illuminating the reticle to approach target specifications for irradiance uniformity at the reticle, the first corrective surface being located proximate to the image plane or a conjugate of the image plane of the illuminator, and the second corrective surface being offset from the image plane or a conjugate of the image plane of the illuminator.

11. The system of claim 10 in which the first corrective surface includes local slope variations for making the local angular redistributions of light.

12. The projection system of claim 11 in which the second corrective surface includes rates of the variation in local slope for making the local spatial redistributions of light.

13. The system of claim 10 in which the first corrective optic compensates for local angular redistributions of light made by the second corrective surface for matching target specifications for telecentricity at the substrate.

14. The system of claim 10 in which the first and second corrective surfaces are respectively formed on at least one of (a) one side of two corrective optics and (b) two sides of one corrective optic.

* * * * *